(12) United States Patent
Schippers et al.

(10) Patent No.: US 7,006,025 B2
(45) Date of Patent: Feb. 28, 2006

(54) METHOD FOR GENERATING A REFERENCE CURRENT FOR SENSE AMPLIFIERS AND CORRESPONDING GENERATOR

(75) Inventors: Stefan Schippers, Peschiera del Garda (IT); Daniele Vimercati, Carate Brianza (IT); Efrem Bolandrina, Fiorano al Serio (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 10/861,340

(22) Filed: Jun. 4, 2004

(65) Prior Publication Data

US 2005/0040977 A1 Feb. 24, 2005

(30) Foreign Application Priority Data

Jun. 4, 2003  (EP) .................................. 03425353

(51) Int. Cl.
*H03M 1/66* (2006.01)
*G11C 11/00* (2006.01)

(52) U.S. Cl. ...................... 341/144; 341/110; 365/158; 365/209

(58) Field of Classification Search ................ 341/155, 341/120; 365/205, 207, 158, 209
See application file for complete search history.

(56) References Cited

U.S. PATENT DOCUMENTS

| 5,880,988 A | * | 3/1999 | Bertin et al. ................... 365/63 |
| 6,141,261 A | | 10/2000 | Robert |
| 6,590,804 B1 | * | 7/2003 | Perner ......................... 365/158 |
| 6,608,773 B1 | * | 8/2003 | Lowrey et al. ............. 365/100 |
| 6,674,679 B1 | * | 1/2004 | Perner et al. ............... 365/209 |
| 2001/0003507 A1 | | 6/2001 | Takafumi et al. |

OTHER PUBLICATIONS

European Search Report for EP 03 42 5353 dated Nov. 10, 2003.

\* cited by examiner

*Primary Examiner*—Peguy JeanPierre
*Assistant Examiner*—Lam T. Mai
(74) *Attorney, Agent, or Firm*—Lisa K. Jorgenson; Bryan A. Santarelli; Graybeal Jackson Haley LLP

(57) ABSTRACT

A method is described for generating a reference current for sense amplifiers connected to cells of a memory matrix comprising the steps of generating a first reference current analog signal through a reference cell, performing an analog-to-digital conversion of the first analog signal into a reference current digital signal, sending the digital signal on a connection line to the sense amplifiers, and performing a digital-to-analog conversion of the digital signal into a second reference current analog signal to be applied as reference current to the sense amplifiers.

16 Claims, 4 Drawing Sheets

METHOD FOR GENERATING A REFERENCE CURRENT FOR SENSE AMPLIFIERS AND CORRESPONDING GENERATOR

PRIORITY CLAIM

This application claims priority from European patent application No. 03425353.4, filed Jun. 4, 2003, which is incorporated herein by reference.

TECHNICAL FIELD

The present invention relates generally to a method for generating a reference current for sense amplifiers connected to cells of a memory matrix.

More specifically, the invention relates to a method for generating a reference current for sense amplifiers connected to cells of a memory matrix comprising a generation step of a first analog reference current signal by means of a reference cell.

The invention also relates to a reference current generator for sense amplifiers connected to cells of a memory matrix, said generator being connected to a reference cell effective to provide an analog reference current signal.

The invention particularly relates, but not exclusively, to a generation method to be used in reading operations on memory cells composing large flash memories and the following description is made with reference to this field of application for convenience of illustration only.

BACKGROUND

As it is well known, a reading operation of a flash memory cell comprised in a large flash memory requires a reading current passing through the cell to be compared with a current, called a reference current, so as to determine if the read cell is a logic "1" or "0".

In particular, if the cell reading current is higher than the reference current, the digital value allocated to the read cell is 1; if the reading current is lower than the reference current, the digital value allocated to the read cell is 0.

The so-obtained digital value is thus the information stored in the read cell.

It is also known that in traditional flash memories the reference current value is obtained by means of a flash memory cell, called reference cell, which is programmed so as to have a reading current value being median between the reading current values of a programmed cell and of an erased cell.

This mean reading current value is transferred by means of a current mirror to all reading comparators or sense amplifiers in a memory cell reading device associated with the flash memory. The mean reading current value is particularly used as a decision threshold by the sense amplifier to determine the digital value stored in the read cells, as shown in FIG. 1.

In particular, this figure schematically shows a portion 10 of a flash memory architecture comprising a sense amplifier 11 connected to a memory cell 12 of a memory matrix 1, this cell 12 corresponding to a selected bitline 2 and wordline 3 and being also indicated as matrix cell.

The sense amplifier 11 is also connected, through a current mirror 13, to a reference cell 14, of the flash type, having in turn a control terminal connected to a reference wordline 15. In particular, the current mirror 13 comprises a first mirror transistor M1 connected to the reference cell 14 as well as a plurality of second mirror transistors Mn connected to each one of the sense amplifiers 11 being provided in the flash memory. The first mirror transistor M1 is connected through a line Ref_mirror to the plurality of sense amplifiers 11.

As seen, the sense amplifier 11 compares a value of a reference current Iref provided by the reference cell 14 with a value of a cell current Icell passing through the selected matrix cell 12, and it provides on an output terminal OUT of the sense amplifier 11 a digital value corresponding to the content of the matrix cell 12.

It is worth noting that the use of a flash reference cell for generating the reference current ensures a same dependence with respect to process, temperature and supply voltage changes of the reference current and the cell current.

In the case of high density flash memories, the reference current distribution along the whole memory cell matrix causes problems linked to parasitic effects. In fact, the sole line Ref_mirror is connected to a large number of sense amplifiers concerning it. The number of these sense amplifiers 11 is further increased in recent construction flash memories to meet speed requirements needed by burst reading operations and to perform simultaneous writing and reading operations.

Moreover, with large memory devices, the physical path of the line Ref_mirror is very long.

These two conditions both produce a high capacitance value in a connection node XRF between the first mirror transistor M1 and the plurality of second mirror transistors Mn in sense amplifiers 11, and thus a high sensitivity to couplings and noises in the flash memory device, as shown in FIG. 2.

In particular, this FIG. 2 shows these undesired effects, i.e., the high capacitance value 21 in the node XRF, the high sensitivity to couplings 22 and noises 23.

In such conditions, couplings with variable signals, such as a clock signal and the signal on a data bus associated with the memory device, as well as noises caused by local changes of a supply voltage and mainly the high parasitic capacitance caused by the signal path length in big-sized devices, such as the conductive paths between the reference cell and sense amplifiers, may cause a reading error which results from the sense amplifiers reading with an actual reference current different from the theoretical current.

The line Ref_mirror is an analog line and thus very sensitive to couplings and noise on a memory device supply line.

In other words, memory devices using a single reference cell reading architecture, as the one shown in FIG. 1, have a safety margin for reading operations performed on their cells being lower than the desired margin and they can even have reading errors.

Another aspect to be considered is that the reference cell consumes currents during its operation and, is thus turned off when the memory device is in a stand-by condition.

When a reading is performed after a stand-by period, it is thus necessary to reactivate the line Ref_mirror since only after this reactivation a reading operation can be performed on matrix cells.

The reactivation operation is however obstructed by the high parasitic load associated with the node XRF.

To overcome these drawbacks it is known to equip memory devices comprising single reference cell reading architectures with accurate precharging, buffering and shielding circuits for reference lines concerning sense amplifiers associated with matrix cells.

In reality, these memory devices are, however, very sensitive to noise and to sudden local supply increases.

Moreover, the time required to set these common or global reference lines is a limiting factor for the device performances during reading operations.

It is also known to use a plurality of local reference cells associated with sense amplifiers. In this case, however, accurate testing operations to set uniformly the reference level must typically be provided. Problems linked to the time needed to perform these tests thus arise, as well as evident problems linked to the area occupation of the reading architecture and thus of the whole memory device.

SUMMARY

An embodiment of the present invention therefore provides a method for generating a current value for a reference line of a memory device, particularly of the flash type, to be used during reading operations of the cells comprised therein and a corresponding circuit architecture having such structural and functional characteristics as to allow a reference current to be generated and transmitted with a low sensitivity to couplings and noises, thus overcoming the limits and drawbacks still affecting memory devices according to the prior art.

This embodiment uses an analog-to-digital conversion to transmit a reference current from a reference cell to the memory device sense amplifiers.

BRIEF DESCRIPTION OF THE DRAWINGS

Features and advantages of the generation method and generator according to the invention will be apparent from the following description of embodiments thereof given by way of non-limiting example with reference to the attached drawings.

In the drawings.

DETAILED DESCRIPTION

The present invention relates generally to a method for generating a reference current for a reference line effective to be connected to a memory device, particularly of the flash type.

As seen with reference to the prior art, a reference current is obtained through a reference cell, advantageously of the flash type, and it is applied to a plurality of sense amplifiers associated with a reading architecture of the memory device.

To simplify the invention description, elements being structurally and functionally identical to elements already described with reference to the prior art will be given the same numeral references.

Figure 1:
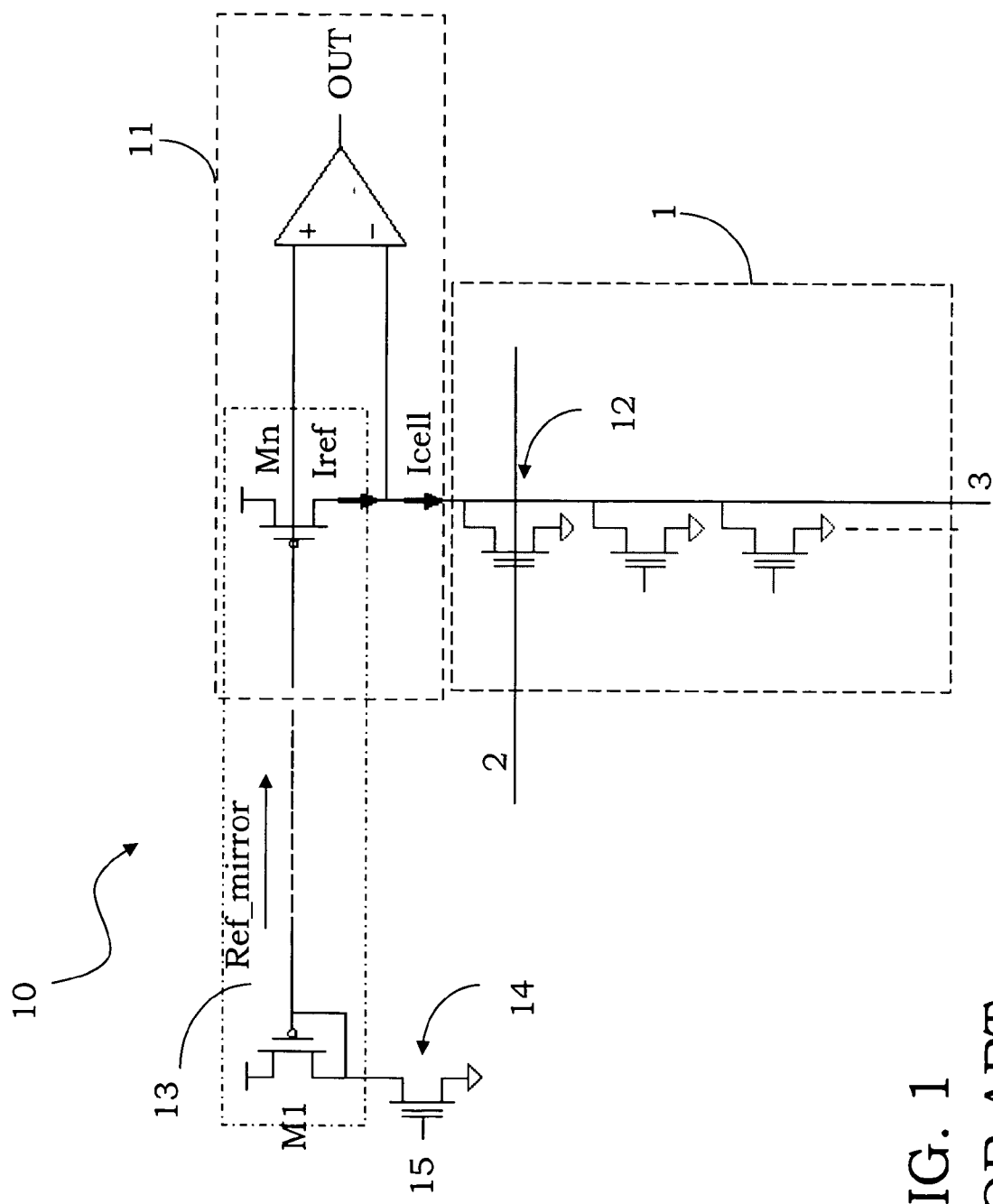
FIG. 1 schematically shows a memory device comprising a single reference cell reading architecture according to the prior art.
Figure 2:
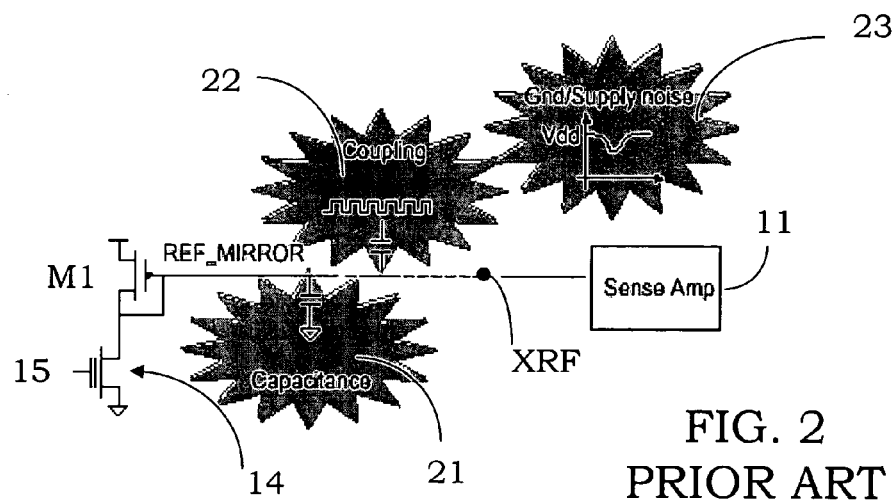
FIG. 2 schematically shows a functional simplification of the device of FIG. 1.
Figure 3:
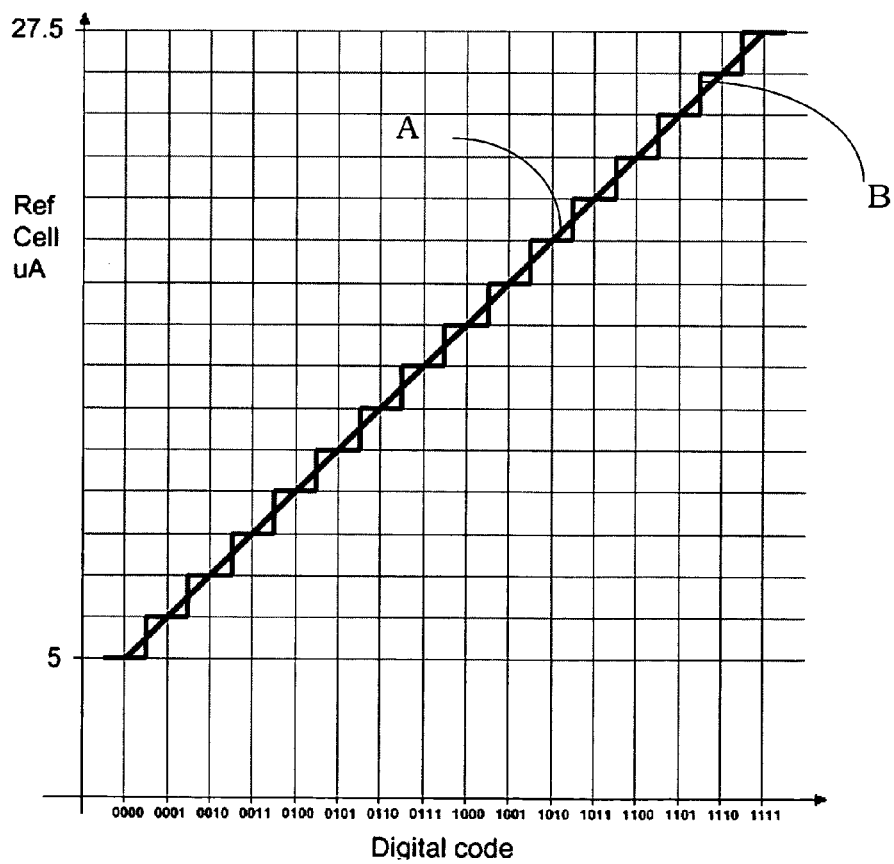
FIG. 3 schematically shows a sampling table used by the method for generating a reference current according to an embodiment of the invention.

Contrary to what happens in known devices, wherein a current mirror is provided to transfer the reference cell current to sense amplifiers 11 to be compared with a reading current of a matrix cell 12, a method according to an embodiment of the invention provides that the reference current REF is digitally coded by applying a convenient sampling thereof, as schematically shown in FIG. 3 showing, by way of example, a 4-bit analog-to-digital conversion with quantization on 16 possible levels for the reference current Iref considered in the range from 5 uA to 27.5 uA with a pitch of 1.5 uA.

In particular, FIG. 3 shows a straight line A corresponding to the analog values that can be taken by the reference current for memory cell reading operations and a stepped line B corresponding to the approximate reference current values obtained through a 4-bit analog-to-digital conversion.

Advantageously, once the analog-to-digital conversion is performed, the reference cell current value is completely defined by a 4-bit digital signal REF_BIT[3:0] obtained from the analog-to-digital conversation.

This digital signal REF_BIT[3:0] is then sent through a digital line to corresponding digital-to-analog conversion blocks to obtain the required reference current value REF1 to be applied to sense amplifiers 11 to perform the reading operations of the memory cells connected thereto.

Advantageously, this digital signal REF_BIT[3:0] obtained from the conversion of the analog value REF of the reference current is substantially free from noises and couplings, eliminating many or all stability problems of the analog line REF_MIRROR and noise affecting prior-art devices.

Figure 4:
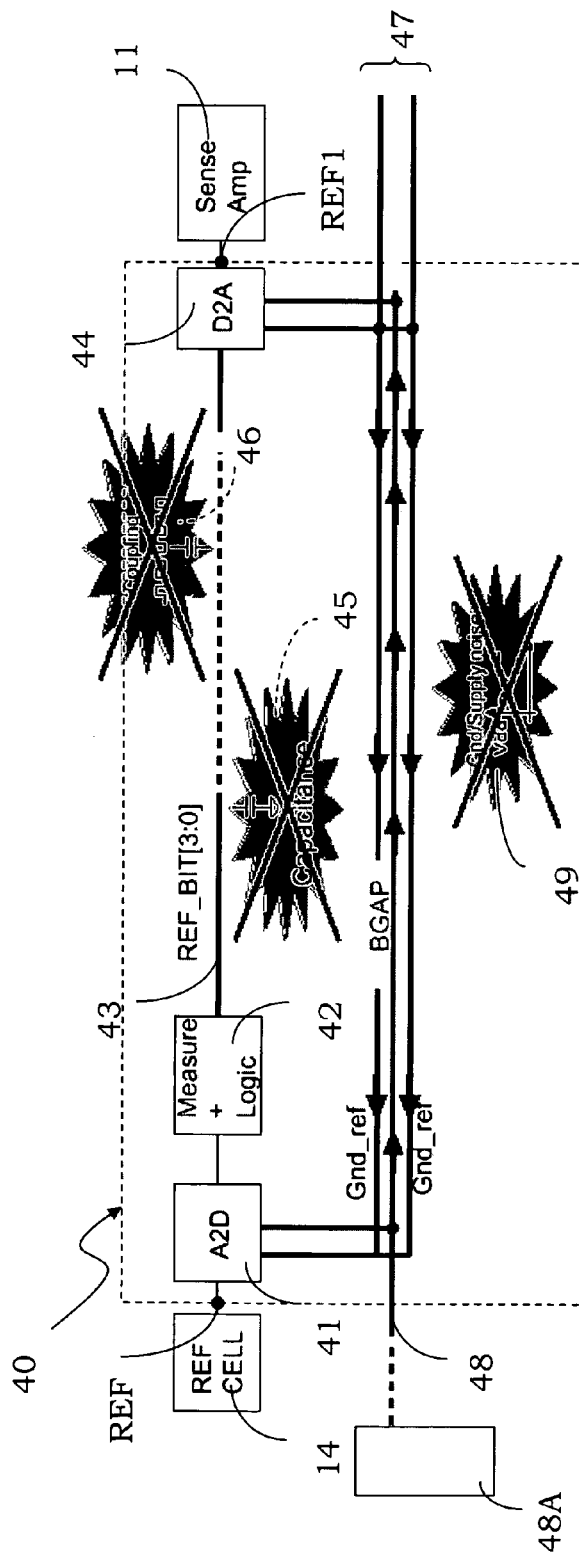
FIG. 4 schematically shows a reference current generator using the method according to an embodiment of the invention.

Referring to FIG. 4, only analog-to-digital conversion operations A2D are added to obtain the digital signal REF_BIT[3:0] corresponding to the reference current analog signal REF coding of the reference cell 14, as well as digital-to-analog conversion operations D2A to reconstruct, starting from the coded value thereof, the digital signal REF_BIT[3:0], an analog value REF1 of the reading reference current to be applied to sense amplifiers 11.

In other words, a method for generating a reference current for sense amplifiers connected to matrix cells of a memory device according to an embodiment of the invention comprises the following steps:

generating a reading current analog signal REF of a reference cell;

converting this analog signal REF into a reading current digital signal REF_BIT[3:0];

sending this digital signal REF_BIT[3:0] to a memory device; and converting this digital signal REF_BIT[3:0] into a reference current analog signal REF1 to be applied to sense amplifiers 11 in this memory device.

At this moment, sense amplifiers 11 can operate as in known memory devices, comparing this reference current analog signal REF1 with the reading currents Icell of the matrix cells 12 connected thereto in order to determine the logic content.

It is worth noting that the reference current digital signal REF_BIT[3:0] may be affected by the following errors:

1. Quantization error: caused by the analog-to-digital conversion process A2D;

2. Error caused by offset between the analog-to-digital conversion process A2D and the inverse digital-to-analog conversion process D2A.

However, it is worth noting that it is possible to set a priori the highest possible value of the quantization error. For example, with a digitization of the current analog signal REF with pitches of 1.5 uA (as shown for example in FIG. 3) a highest quantization error of 0.75 uA is obtained.

As for the error caused by offset, it is worth noting that the offset existing between conversion processes A2D and D2A can be actually compared with the asymmetry of prior art devices wherein the reference current in sense amplifiers 11 is reconstructed by using transistors being equal to the current mirror transistor performing the reference current transfer from the reference cell 13 to sense amplifiers 11.

This method is advantageous with respect to known methods since it is substantially free from errors caused by couplings and parasitic capacitance, though being still subject to a slight quantization error having a highest value being known a priori.

A reference current generator effective to implement this method is shown in FIG. 4, globally indicated with 40.

The generator 40 is connected between a reference cell 14 effective to provide a reference current analog signal REF and at least a sense amplifier 11 effective to receive a reference current analog signal REF1 to perform comparison operations with a reading current signal Icell passing through a matrix cell 12 (not shown in FIG. 4) connected thereto.

Advantageously according to an embodiment of the invention, the generator 40 comprises, in cascade connection, an analog-to-digital conversion block 41 to perform the conversion of the analog signal REF connected to a measure and logic calculation block 42, connected in turn to a digital line 43 whereon the reference current conversion digital signal REF_BIT[3:0] is sent.

In particular, the measure and logic calculation block 42 allows a periodical updating of the digital signal REF_BIT[3:0] to be implemented, as it will be explained hereafter.

The digital line 43 is connected to a digital-to-analog conversion block 44 to perform the conversion of the digital signal REF_BIT[3:0] into the reference current analog signal REF1 to be applied to the sense amplifiers 11.

As shown in FIG. 4, the digital line 43 is substantially free from the effects linked to the capacitive values 45 and to the couplings 46 affecting the line REF_MIRROR used to transfer to sense amplifiers 11 the reference current in prior art devices.

Moreover, the generator 40 provides a first 47 and second 48 dedicated lines connected to conversion blocks 41 and 44.

In particular, the first dedicated line 47 provides conversion blocks 41 and 44 with a voltage reference, particularly a ground Gnd_ref, while the second dedicated line 48 provides these blocks with a reference signal BGAP of the band-gap type obtained by means of a conventional band-gap generator 48A.

The use of these dedicated lines 47 and 48 allows the problems linked to noises 49 to be reduced or eliminated, as shown in FIG. 4.

Figure 5:
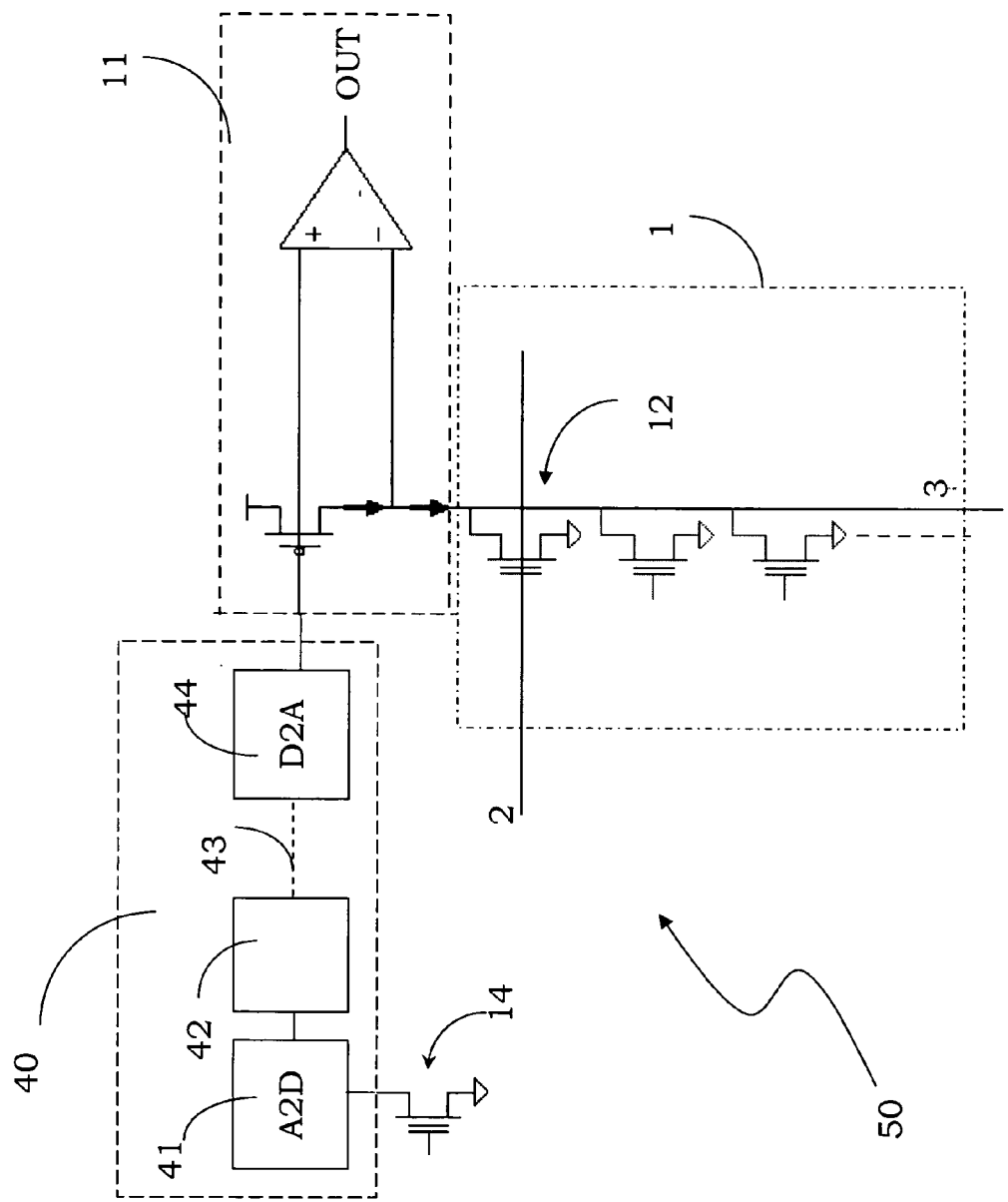
FIG. 5 schematically shows a memory device comprising a reference current generator according to an embodiment of the invention.

A memory device 50 equipped with a single reference cell reading architecture is thus obtained according to an embodiment of the invention, as schematically shown in FIG. 5.

Particularly, the memory device 50 comprises a memory cell matrix 1 wherein a memory cell 12 is selected through a bitline 2 and a wordline 3.

The memory device 50 comprises a reference current generator 40 connected between a reference cell 14 and the sense amplifiers 11 and manufactured as previously indicated.

In an alternative embodiment of the method for generating a reference current according to the invention, it is possible to take into consideration temperature and voltage changes undergone by the reference cell and memory cells to avoid reading errors connected to these variations to occur. In this case, a method for generating the reference current provides that conversion processes A2D and D2A are periodically performed, even when the memory device is in the stand-by condition.

In particular, the updating frequency can be set at about one update per second, in order to pursue environmental temperature changes and also bias changes (for example battery voltage changes in mobile applications).

Such an updating frequency typically does not involve considerable increases in the memory device stand-by current but only negligible current increases caused by turning on a dedicated circuit performing the updating of conversion processes.

Figure 6:
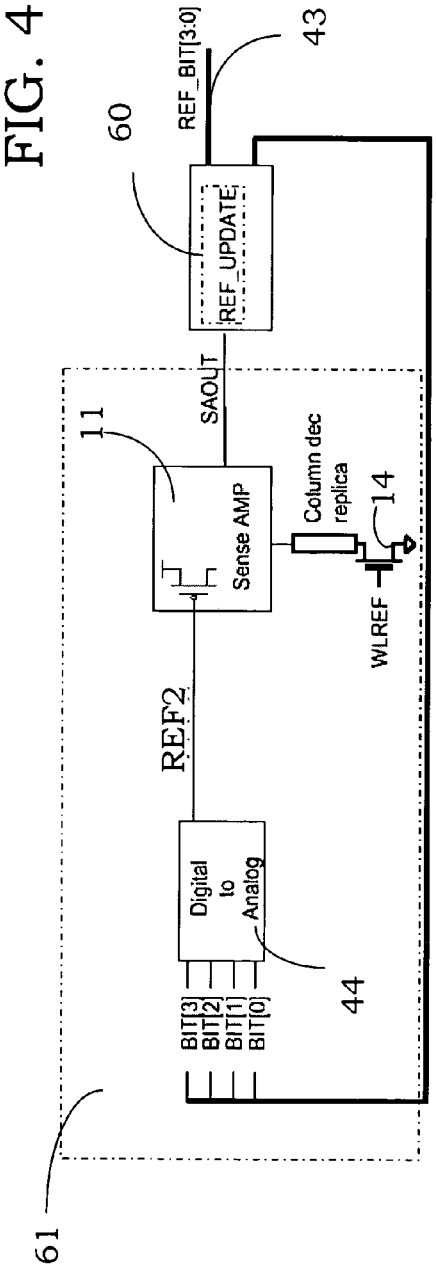
FIG. 6 schematically shows an updating circuit associated with the generator of FIG. 4 according to an embodiment of the invention.

FIG. 6 schematically shows, globally indicated with 60, an updating circuit of the reference current digital signal REF_BIT[3:0].

In particular, the updating circuit 60 comprises a state machine REF_UPDATE.

According to an embodiment of the invention, the updating circuit 60 is connected between a corresponding sense amplifier 11 of the memory device and the line 43 of the digital signal REF_BIT[3:0]. The sense amplifiers 11 and the state machine REF_UPDATE as a whole form the measure and logic calculation block 42 indicated in FIG. 4.

The sense amplifier 11 is connected to the digital-to-analog D2A conversion block 44 and to a reference cell 14.

According to an embodiment of the invention, the conversion D2A block 44 is input a digital signal REF_BIT[3:0] coming from the updating circuit 60 and it provides a reconstructed analog current REF2.

The reference cell 14 is periodically read with the sense amplifier 11, which compares the reference current obtained from the reference cell 14 with the current analog signal REF2 obtained from the conversion D2A block 44.

The digital signal BIT[3:0] being input at the conversion D2A block 44, in the considered example a 4-bit code, is generated by the state machine REF_UPDATE comprised in the updating circuit 60. In particular, this state machine REF_UPDATE increases or decreases the digital signal BIT[3:0] until a signal SAOUT being output from the sense amplifier 11 changes state.

In fact the changing state of the signal SAOUT indicates that the reconstructed current analog signal REF2 is equal to the current of the reference cell 14.

At this point, the digital signal BIT[3:0] is sent on the line 43 and allocated as value of the digital signal REF_BIT[3:0] to be sent to sense amplifiers 11.

According to an embodiment of the invention, in correspondence with predetermined periodical ranges, the updating circuit 60 turns the reference cell 14 on and it updates the value of the digital signal REF_BIT[3:0] on the line 43.

It is important to underline the fact that the analog-to-digital conversion A2D performed on the current of the reference cell 14 of the updating circuit 60 is performed by using the same structures (sense amplifier 11 and digital-to-analog conversion block 44 globally indicated with 61 in FIG. 6) existing in the memory device, thus eliminating errors caused by different modes of performing a reference measurement.

In conclusion, the current generator implementing methods according to embodiments of the invention are relatively free from noises and couplings.

Moreover, the digital signal corresponding to the reference current is typically always available (no setup time at the first reading after a stand-by) and can be periodically updated to take into consideration the temperature and supply voltage time changes.

The updating frequency can be such as not to considerably weigh on the stand-by consumption.

Although a quantization error linked to conversion processes A2D and D2A is introduced, the highest value of this error is however known a priori. Furthermore, it is worth noting that this quantization error can be reduced for example by increasing the number of bits coding the current analog signal.

An electronic system, such as a computer system, can incorporate the memory of FIG. 5.

Referring to FIG. 4, in one embodiment the A2D 41 can be omitted, and the circuit 42 can periodically measure the value of IRef from the reference cell 14 with the sense amp 11 as described above, store the corresponding digital value, and provide the corresponding digital value to the D2A 44 as the digital value to the D2A 44 as the digital value of IRef. Or, the circuit 42 can act as a converter that converts the digital value from A2D 41 into the corresponding digital value of D2A 44, where A2D 41 and D2A 44 are offset from one another.

From the foregoing it will be appreciated that, although specific embodiments of the invention have been described herein for purposes of illustration, various modifications may be made without deviating from the spirit and scope of the invention.

What is claimed is:

1. A method for generating a reference current for sense amplifiers connected to cells of a memory matrix comprising the steps of:
    generating a first reference current analog signal through a reference cell;
    wherein that it further comprises the steps of:
    performing an analog-to-digital conversion of said first analog signal into a reference current digital signal;
    sending said digital signal on a connection line to said sense amplifiers; and
    performing a digital-to-analog conversion of said digital signal into a second reference current analog signal to be applied as reference current to said sense amplifiers.

2. A generation method according to claim 1, further providing a periodical updating step of said digital signal.

3. A generation method according to claim 2, wherein said periodical updating step comprises the following steps of:
    turning said reference cell on and reading a reference current through said sense amplifiers;
    generating a digital signal through a state machine;
    performing a digital-to-analog conversion of said digital signal to generate a third reconstructed current analog signal;
    comparing said reference current of said reference cell with said third reconstructed current analog signal;
    increasing and/or decreasing said digital signal until a commutation of a signal output from said sense amplifier; and
    sending said digital signal on said connection line and allocation of said digital signal as value of said digital signal.

4. A generation method according to claim 2, wherein said periodical updating step is performed at such a frequency as to pursue environmental temperature and bias changes undergone by said cells of said memory matrix.

5. A generation method according to claim 4, wherein said periodical updating step is performed at a frequency of an update per second.

6. A generation method according to claim 1, wherein said analog-to-digital conversion step comprises a 4-bit conversion with quantization on 16 levels.

7. A generator of a reference current for sense amplifiers connected to cells of a memory matrix, said generator being connected to a reference cell effective to provide a reference current analog signal and comprising:
    an analog-to-digital conversion block inserted between said reference cell and a connection line and effective to perform a conversion of said reference current analog signal in a digital conversion signal of the reference current sent on said one connection line; and
    a digital-to-analog conversion block inserted between said connection line and said sense amplifiers and effective to perform a conversion of said digital signal received from said connection line into a reference current analog signal to be applied to said sense amplifiers.

8. A generator according to claim 7, further comprising at least a first dedicated line connected to said analog-to-digital and digital-to-analog conversion blocks and effective to provide a voltage reference.

9. A generator according to claim 7, further comprising at least a second dedicated line connected to said analog-to-digital and digital-to-analog conversion blocks and effective to provide a band-gap reference signal.

10. A generator according to claim 9, further comprising at least a band-gap generator connected to said second dedicated line.

11. A generator according to claim 7, further comprising an updating circuit of said reference current digital signal connected between said sense amplifiers and said connection line, said updating circuit comprising a state machine effective to generate a digital signal applied to said digital-to-analog conversion block, effective in turn to provide a reconstructed current analog signal.

12. A generator according to claim 11, wherein said updating circuit causes a turn on of said reference cell, a reading of a corresponding reference current by said sense amplifiers and a comparison of said reference current with said reconstructed current analog signal and in that said state machine increases and/or decreases said digital signal until a commutation of a signal output from said sense amplifiers is performed.

13. A generator according to claim 12, wherein said state machine sends, in correspondence with said commutation of a signal output from said sense amplifiers, said digital signal on said connection line, allocating it as updated value of said digital signal.

14. A generator according to claim 12, wherein said updating circuit turns said reference cell on and it periodically updates said value of said digital signal with predetermined frequency.

15. A generator according to claim 14, wherein said updating circuit provides such a frequency as to pursue environmental temperature and bias changes undergone by said cells of said memory matrix.

16. A generator according to claim 14, wherein said updating circuit provides a frequency of an update per second.

* * * * *